(12) United States Patent
Yates

(10) Patent No.: US 7,759,053 B2
(45) Date of Patent: *Jul. 20, 2010

(54) METHODS OF FABRICATING INTEGRATED CIRCUITRY

(75) Inventor: Donald L. Yates, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 922 days.

This patent is subject to a terminal disclaimer.

(21) Appl. No.: 11/497,688

(22) Filed: Jul. 31, 2006

(65) Prior Publication Data

US 2006/0263965 A1 Nov. 23, 2006

Related U.S. Application Data

(63) Continuation of application No. 10/299,165, filed on Nov. 18, 2002, now Pat. No. 7,419,768.

(51) Int. Cl.
G03F 7/00 (2006.01)
G03F 7/26 (2006.01)
G03F 7/40 (2006.01)

(52) U.S. Cl. ............ 430/331; 430/313; 430/314; 430/318; 430/322; 430/323; 430/324; 134/28

(58) Field of Classification Search ................ 430/313, 430/314, 318, 322, 323, 324, 325, 331; 134/28
See application file for complete search history.

(56) References Cited

U.S. PATENT DOCUMENTS

| | | | |
|---|---|---|---|
| 4,840,923 A | 6/1989 | Flagello et al. | |
| 5,780,359 A | 7/1998 | Brown et al. | |
| 5,895,264 A | 4/1999 | Teo | |
| 5,939,336 A | 8/1999 | Yates | |
| 6,012,469 A | 1/2000 | Li et al. | |
| 6,090,721 A | 7/2000 | Yates | |
| 6,117,351 A | 9/2000 | Li et al. | |
| 6,126,853 A | 10/2000 | Kaufman et al. | |
| 6,192,899 B1 | 2/2001 | Li et al. | |
| 6,316,370 B1 | 11/2001 | Mercaldi et al. | |
| 6,350,322 B1 | 2/2002 | Yates | |
| 6,358,793 B1 | 3/2002 | Yates et al. | |

(Continued)

OTHER PUBLICATIONS

Archer et al., *Removing postash polymer residue from BEOL structures using inorganic chemicals*, Micro, 6 pages (Jun. 2001).

*Primary Examiner*—Amanda C. Walke
(74) *Attorney, Agent, or Firm*—WElls St. John P.S.

(57) ABSTRACT

The invention includes methods of fabricating integrated circuitry and semiconductor processing polymer residue removing solutions. In one implementation, a method of fabricating integrated circuitry includes forming a conductive metal line over a semiconductor substrate. The conductive line is exposed to a solution comprising an inorganic acid, hydrogen peroxide and a carboxylic acid buffering agent. In one implementation, a method of fabricating integrated circuitry includes forming an insulating layer over a semiconductor substrate. A contact opening is at least partially formed into the insulating layer. The contact opening is exposed to a solution comprising an inorganic acid, hydrogen peroxide and a carboxylic acid buffering agent. In one implementation, a semiconductor processing polymer residue removing solution comprises an inorganic acid, hydrogen peroxide and a carboxylic acid buffering agent. Other aspects and implementations are contemplated.

25 Claims, 2 Drawing Sheets

U.S. PATENT DOCUMENTS

| | | |
|---|---|---|
| 6,444,583 B2 | 9/2002 | Aoki |
| 6,453,914 B2 | 9/2002 | Torek et al. |
| 6,486,108 B1 | 11/2002 | Yates et al. |
| 6,497,827 B1 | 12/2002 | Li et al. |
| 6,517,738 B1 | 2/2003 | Torek et al. |
| 6,539,963 B1 | 4/2003 | Dunn |
| 6,551,935 B1 | 4/2003 | Sinha et al. |
| 6,562,719 B2 | 5/2003 | Kondo et al. |
| 6,562,726 B1 | 5/2003 | Torek et al. |
| 6,573,554 B2 | 6/2003 | Yates et al. |
| 6,601,595 B2 | 8/2003 | Yates |
| 6,607,001 B1 | 8/2003 | Yates |
| 6,620,216 B2 | 9/2003 | Oshima et al. |
| 6,627,001 B2 | 9/2003 | Chen |
| 6,635,515 B2 | 10/2003 | Okuaki |
| 6,639,266 B1 | 10/2003 | Yates |
| 6,641,677 B1 | 11/2003 | Yates |
| 6,645,311 B2 | 11/2003 | Yates |
| 6,656,289 B2 | 12/2003 | Yates |
| 6,656,372 B2 | 12/2003 | Yates |
| 6,673,675 B2 | 1/2004 | Yates et al. |
| 6,703,319 B1 | 3/2004 | Yates et al. |
| 6,713,397 B2 | 3/2004 | Kobayashi |
| 6,740,248 B2 | 5/2004 | Li et al. |
| 6,743,641 B2 | 6/2004 | Yates et al. |
| 6,750,128 B2 | 6/2004 | Kondo et al. |
| 6,762,132 B1 | 7/2004 | Yates |
| 6,773,873 B2 | 8/2004 | Seijo et al. |
| 6,783,695 B1 | 8/2004 | Torek et al. |
| 6,794,704 B2 | 9/2004 | Yates et al. |
| 6,830,627 B1 | 12/2004 | Covert et al. |
| 7,419,768 B2 * | 9/2008 | Yates .................. 430/313 |
| 2002/0055209 A1 | 5/2002 | Kusumoto et al. |
| 2002/0139387 A1 | 10/2002 | Yates |
| 2002/0165105 A1 | 11/2002 | Yates et al. |
| 2002/0165106 A1 | 11/2002 | Yates et al. |
| 2002/0165107 A1 | 11/2002 | Yates et al. |
| 2002/0169089 A1 | 11/2002 | Yates et al. |
| 2002/0173156 A1 | 11/2002 | Yates et al. |
| 2002/0187906 A1 | 12/2002 | Yates et al. |
| 2003/0003754 A1 | 1/2003 | Yokoi et al. |
| 2003/0148624 A1 | 8/2003 | Ikemoto et al. |
| 2003/0216269 A1 | 11/2003 | DeYoung et al. |
| 2004/0029392 A1 | 2/2004 | Morgan |
| 2004/0043610 A1 | 3/2004 | Yates |
| 2005/0069676 A1 | 3/2005 | Nakamura et al. |

* cited by examiner

METHODS OF FABRICATING INTEGRATED CIRCUITRY

RELATED PATENT DATA

This patent resulted from a continuation application of U.S. patent application Ser. No. 10/299,165, filed Nov. 18, 2002, entitled "Methods of Fabricating Integrated Circuitry", naming Donald L. Yates as inventor, the disclosure of which is incorporated by reference.

TECHNICAL FIELD

This invention relates to methods of fabricating integrated circuitry and to semiconductor processing polymer residue removing solutions.

BACKGROUND OF THE INVENTION

Integrated circuitry fabrication in semiconductor processing typically forms contact openings, passageways or vias through insulating materials for interconnecting different conductive components. Further, integrated circuitry fabrication typically forms conductive metal lines as transistor gate lines or for interconnecting, energizing or accessing different electronic components.

A typical method of forming contact openings and metal lines is by subtractive etching using one or more masking layers. One exemplary masking material is photoresist. At the completion of the etching using a photoresist masking layer, the photoresist is typically etched from the substrate and does not constitute a part of the finished circuitry construction. In certain instances, the act of etching the photoresist from the substrate can leave undesired polymer residue over the conductive lines or within the contact openings. This has become particularly problematic as the dimensions of openings and lines are becoming ever smaller to enable maximizing circuit density.

One exemplary process and aqueous solution for removing polymer residue from a substrate in such instances is described in an article of *Micro*, June 2001, entitled "Removing postash polymer residue from BEOL structures using inorganic chemicals". Such utilizes a solution composed of sulfuric acid, hydrogen peroxide, hydrogen fluoride and water.

One material presently finding use in the formation of conductive lines in semiconductor fabrication is elemental aluminum or aluminum alloys. Unfortunately, the sulfuric acid, hydrogen peroxide and hydrogen fluoride solutions presently being used can also significantly etch aluminum and aluminum alloys. Accordingly, care is taken when utilizing such solutions to ensure that the substrates are exposed to such solutions effective to remove the polymer residue, but not to a degree to significantly etch aluminum containing lines or other structures on the substrate. The present method by which this is achieved is in use of spray-rinse processors which, over a short time interval, spray the substrates with the solution. This is rapidly followed by a substantially pure, de-ionized water rinse.

While the invention was motivated in addressing the above issues and improving upon the above-described drawbacks, it is in no way so limited. The invention is only limited by the accompanying claims as literally worded (without interpretative or other limiting reference to the above background art description, remaining portions of the specification, or the drawings), and in accordance with the doctrine of equivalents.

SUMMARY

The invention includes methods of fabricating integrated circuitry and semiconductor processing polymer residue removing solutions. In one implementation, a method of fabricating integrated circuitry includes forming a conductive metal line over a semiconductor substrate. The conductive line is exposed to a solution comprising an inorganic acid, hydrogen peroxide and a carboxylic acid buffering agent. In one implementation, a method of fabricating integrated circuitry includes forming an insulating layer over a semiconductor substrate. A contact opening is at least partially formed into the insulating layer. The contact opening is exposed to a solution comprising an inorganic acid, hydrogen peroxide and a carboxylic acid buffering agent. In one implementation, a semiconductor processing polymer residue removing solution comprises an inorganic acid, hydrogen peroxide and a carboxylic acid buffering agent.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
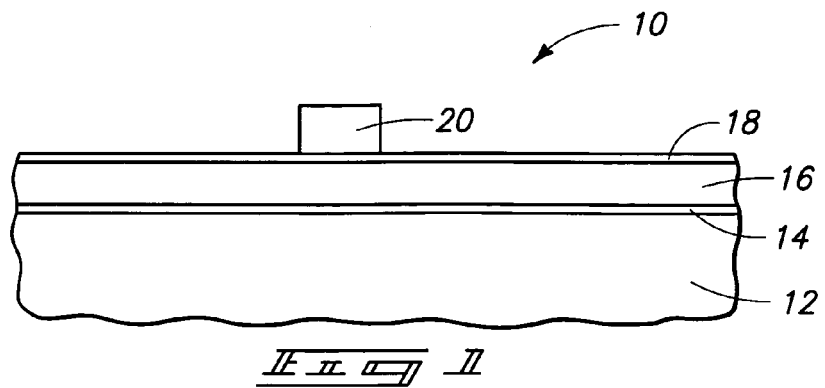
FIG. 1 is a diagrammatic sectional view of a semiconductor substrate fragment at one processing point in accordance with an aspect of the invention.

An exemplary method of fabricating integrated circuitry is initially described with reference to FIGS. 1-4. Referring initially to FIG. 1, a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated.

In the first-described exemplary embodiments, substrate fragment 10 comprises a semiconductor substrate 12 which would typically be composed of multiple different layers and materials. The initial discussion proceeds with exemplary methods of forming a conductive metal line over substrate 12. In the context of this document, a "metal line" is defined as a conductive conduit/interconnect having a length greater than its maximum width and thickness and where at least a majority of it along its length consists essentially of "metal". In the context of this document, "metal" is defined to mean any one or combination of one or more elemental metals, one or more alloys of at least two elemental metals, and one or more conductive metal compounds. FIG. 1 depicts three exemplary metal layers 14, 16 and 18. Exemplary thicknesses are about 100 Angstroms, about 3000 Angstroms and about 200 Angstroms, respectively. An exemplary material for layer 14 is titanium. An exemplary material for layer 18 is titanium nitride. An exemplary material for layer 16 is elemental aluminum and/or an alloy of aluminum and copper (i.e., 99.5 weight percent aluminum and 0.5 weight percent copper). A patterned carbon containing masking layer 20 is formed over layers 14, 16 and 18. An exemplary preferred material is photoresist processed by any existing or yet-to-be developed photolithographic or other techniques.

Figure 2:
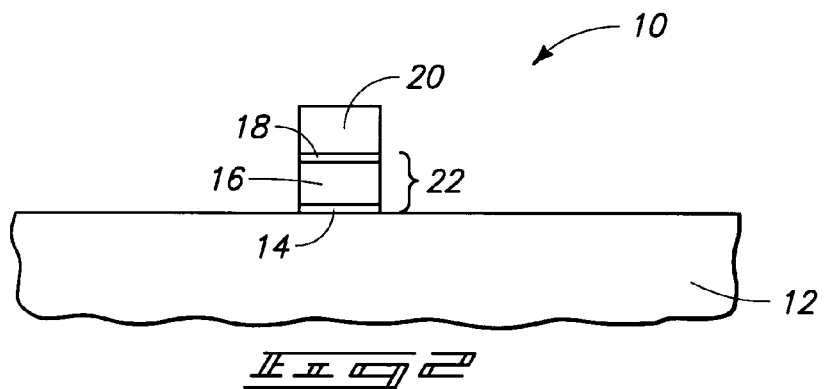
FIG. 2 is a view of the FIG. 1 substrate fragment at a processing step subsequent to that shown by FIG. 1.

Referring to FIG. 2, layers 14, 16 and 18 have been etched using masking layer 20 to form a conductive metal line 22. In one preferred implementation, metal of the metal line comprises elemental aluminum, aluminum alloy or a combination thereof. In one preferred embodiment, at least a majority of the metal in the metal line comprises elemental aluminum, aluminum alloy or a combination thereof. In one preferred implementation, aluminum present in the line is predominately present in at least one of elemental form and alloy form. In one preferred embodiment, the conductive metal line consists essentially of metal, for example as shown. An exemplary gas for etching aluminum includes BCl3, whereas exemplary gases for etching TiN are NF3 and CF4.

The above preferred processing describes but one exemplary and preferred method of forming a conductive metal line over a semiconductor substrate. In certain implementations, any other method of forming a conductive metal line over a substrate is contemplated, for example with or without using a masking layer, and whether existing or yet-to-be developed.

Figure 3:
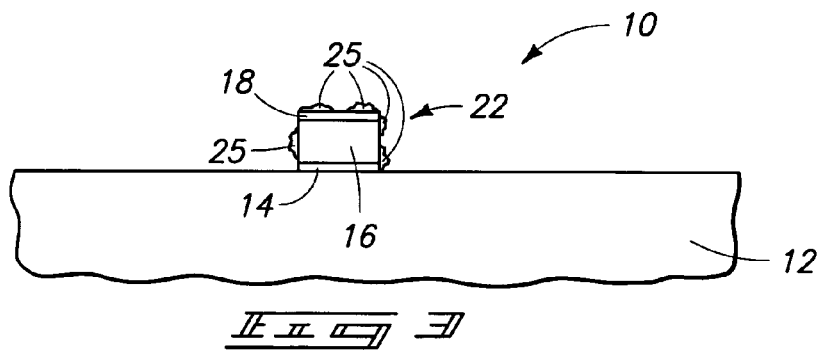
FIG. 3 is a view of the FIG. 2 substrate fragment at a processing step subsequent to that shown by FIG. 2.

Referring to FIG. 3, carbon containing masking layer 20 (not shown) has been etched from the substrate. An exemplary method for doing so where the masking layer is photoresist includes $O_2$ plasma which can be conducted in situ within the chamber(s) in which the etching was conducted to produce the exemplary FIG. 2 construction. In but one exemplary embodiment, at least one of the carbon containing masking layer etching (i.e., that which would occur to produce the FIG. 3 construction) and the aluminum or other metal comprising layer etching (i.e., that which would occur to produce the FIG. 2 construction) leaves a polymer residue 25 over some portions of conductive line 22. By way of example only, FIG. 3 depicts a discontinuous residue 25 forming over line 22, including over sidewalls of conductive line 22. Such might alternately be formed to completely cover the depicted construction. An example undesired polymer residue which is formed includes carbon and fluorine atoms.

Figure 4:
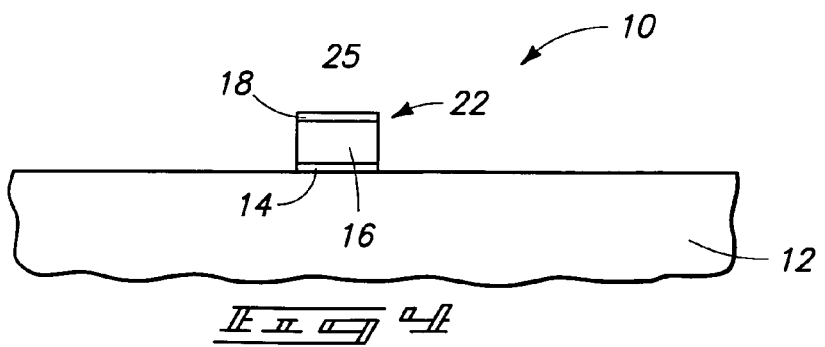
FIG. 4 is a view of the FIG. 3 substrate fragment at a processing step subsequent to that shown by FIG. 3.

Referring to FIG. 4, conductive metal line 22 (including sidewalls thereof) has been exposed to a solution comprising an inorganic acid, hydrogen peroxide and a carboxylic acid buffering agent. In one preferred implementation, such exposing is effective to remove at least some, more preferably at least a majority, and most preferably all, of residue 25 from over conductive metal line 22. Exemplary methods of conducting the exposing include spraying the substrate, for example in liquid form or in a combination of gas and liquid. One most preferred exemplary method of exposing comprises bath immersion. Further and regardless, certain aspects of the invention contemplate exposing the conductive metal line to a solution comprising an inorganic acid, hydrogen peroxide and a carboxylic acid buffering agent independent of whether polymer residue is formed, and independent of removing such residue if it is formed.

Exemplary and preferred inorganic acids include $H_3PO_4$ and $H_2SO_4$, with $H_2SO_4$ being more preferred. Exemplary preferred carboxylic acid buffering agents include those derived, at least in part, from the group consisting of ammonium citrate, ammonium lactate, ammonium oxalate, and mixtures thereof. In one preferred implementation, the solution comprises ammonium ions/counterions.

Preferably, the solution has a pH of from 3.0 to 7.0, with a pH range of from 3.8 to 4.8 being more preferred. During the exposing, the solution is preferably at a temperature from 18° C. to 40° C., with an exemplary preferred pressure during exposure being ambient atmospheric pressure. By way of example only, an exemplary preferred exposure time is anywhere from 30 seconds to 5 minutes.

In one preferred embodiment, the solution includes HF.

Exemplary preferred concentrations and ranges are inorganic acid being present at from 1.0 weight percent to 15.0 weight percent; hydrogen peroxide being present at from 1.0 weight percent to 15.0 weight percent; HF being present at from 0 to 1,000 ppm by weight (with 50-200 ppm by weight being more preferred); and with the remainder being water. A solution as just described but without any effective carboxylic acid buffering agent typically has a pH below 2.0. A carboxylic acid buffering agent is ideally provided within the solution in a preferred quantity effective to raise the pH to above 3.0, and more preferably to provide a pH range of from 3.8 to 4.8. One exemplary preferred solution into which a carboxylic acid buffering agent can be provided is DSP+ available from Kanto Corporation of Portland, Oreg. DSP+ is understood to constitute 7 weight percent sulfuric acid, 7 weight percent hydrogen peroxide and 100 ppm HF, with the remainder at slightly less than 86 weight percent being water. In accordance with aspects of the invention, a usable solution was created by adding 200 grams/liter of diammonium citrate salt, which resulted in a stable pH of around 4.

Again in one preferred embodiment, an immersion bath is created or otherwise provided containing the above preferred embodiment solution. A substrate with the conductive metal line is immersed into such bath. In one exemplary preferred aspect, polymer residue was formed over the conductive line and the immersion is effective to remove at least some, and preferably at least a majority, of the residue from over the conductive line.

In one reduction-to-practice example, the exemplary FIG. 3 construction was created. A bath was provided having the above DSP+ with 200 grams/liter of diammonium citrate salt dissolved therein. Such solution had a pH of about 4. The solution was provided at ambient pressure conditions and at a temperature of about 30° C. A plurality of wafers was immersed in the bath for 60 seconds. Control wafers were processed in a bath under the same conditions containing solely DSP+, and another batch of control wafers was not processed to remove any polymer residue that might have formed. Subsequent identical processing was conducted on all of the wafers described above. At probe testing, the wafers processed with the above solution in accordance with the invention outperformed both control groups in terms of yield and percentage of open structures for 0.12 micron width lines. Further, the condition of the metal was examined in the DSP+ control group and the DSP+ containing the carboxylic acid buffering agent group. The DSP+ processed substrates showed pitting of the exposed aluminum, whereas the carboxylic acid buffered DSP+ processed substrates showed negligible, if any, attack on the aluminum.

It is theorized that the carboxylic acid buffered solution at an appropriate pH, for example of at least 3.0 and more preferably from 3.8 to 4.8, passivates the aluminum surfaces to preclude etching of the aluminum.

Figure 5:
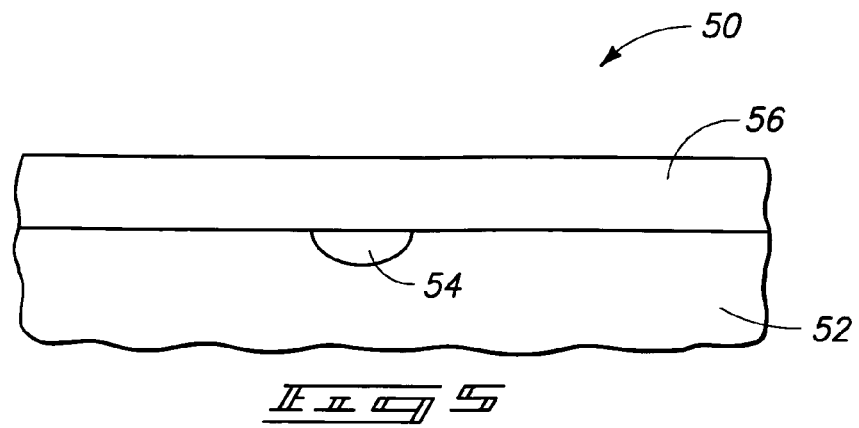
FIG. 5 is a diagrammatic sectional view of an alternate semiconductor substrate fragment at one processing point in accordance with an aspect of the invention.

In accordance with aspects of the invention, an exemplary alternate embodiment is described with reference to FIGS. 5-7. FIG. 5 depicts a wafer fragment or semiconductor substrate 50. By way of example only, such includes a bulk monocrystalline substrate 52 having a conductive diffusion region 54 formed therein. One or more insulative materials 56 is formed over semiconductor substrate 52. An exemplary preferred material is borophosphosilicate glass (BPSG) deposited to an exemplary thickness of 5,000 Angstroms.

Figure 6:
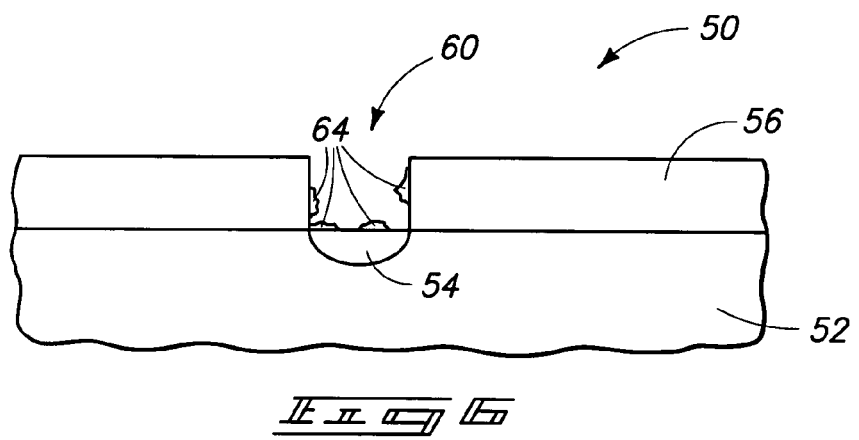
FIG. 6 is a view of the FIG. 5 substrate fragment at a processing step subsequent to that shown by FIG. 5.

Referring to FIG. 6, a contact opening 60 has been at least partially formed into insulating layer 56, with the exemplary opening 60 being shown formed entirely through insulating layer 56 to expose exemplary diffusion region 54. Such might be conducted by photolithographic patterning and etch, or by other existing or yet-to-be developed methods. In one exemplary aspect and as shown in FIG. 6, a polymer residue 64 is shown as having been formed within contact opening 60.

Figure 7:
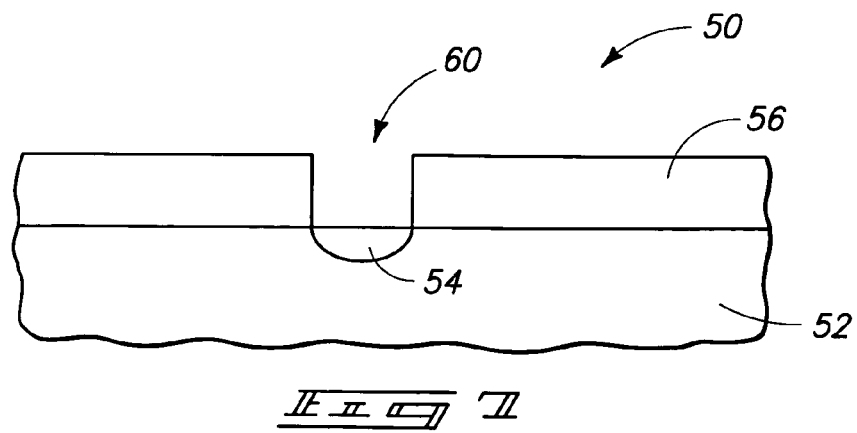
FIG. 7 is a view of the FIG. 6 substrate fragment at a processing step subsequent to that shown by FIG. 6.

Referring to FIG. 7, contact opening 60 has been exposed to a solution comprising an inorganic acid, hydrogen peroxide and a carboxylic acid buffering agent. All aspects and preferred solutions are as described above with respect to the first described embodiment. Further, certain aspects of the invention contemplate exposure of the contact opening to such exemplary solution(s) regardless of any polymer residue formation, and regardless of whether such polymer is removed as a result of the exposing. Exemplary exposing methods include spraying, bath immersion and any other method whether existing or yet-to-be developed.

The invention also contemplates a semiconductor processing polymer residue removing solution comprising an inorganic acid, hydrogen peroxide and a carboxylic acid buffering agent independent of the methods described above. Preferably, such a solution has some or a combination of the attributes of the solution(s) used in the methods described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of fabricating integrated circuitry comprising:
   forming an aluminum-comprising conductive metal line over a semiconductor substrate; and
   exposing at least sidewalls of the aluminum-comprising conductive metal line to a solution comprising an inorganic acid, hydrogen peroxide and a carboxylic acid buffering agent selected from the group consisting of ammonium citrate, ammonium oxalate, and mixtures thereof.

2. The method of claim 1 wherein the carboxylic acid buffering agent comprises ammonium citrate.

3. The method of claim 2 wherein the ammonium citrate is derived at least in part from adding diammonium citrate salt to an aqueous solution.

4. The method of claim 1 wherein the carboxylic acid buffering agent comprises ammonium oxalate.

5. The method of claim 1 wherein the inorganic acid comprises $H_3PO_4$.

6. The method of claim 1 wherein the inorganic acid comprises $H_2SO_4$.

7. The method of claim 1 wherein the solution has a pH of from 3.8-4.8.

8. The method of claim 1 wherein the conductive metal line consists essentially of metal.

9. A method of fabricating integrated circuitry comprising:
   forming a patterned carbon-containing masking layer over an aluminum-comprising layer;
   using the masking layer, etching the aluminum-comprising layer to form an aluminum-comprising conductive metal line;
   after forming the aluminum-comprising conductive metal line, etching the carbon-containing masking layer from the substrate, at least one of the carbon-containing masking layer etching and the aluminum-comprising layer etching leaving a polymer residue over at least some of the aluminum-comprising conductive metal line;
   providing an immersion bath containing a solution comprising sulfuric acid, hydrogen peroxide, and a carboxylic acid buffering agent selected from the group consisting of ammonium citrate, ammonium oxalate, and mixtures thereof; the sulfuric acid being present in the bath at from 1.0 weight percent to 15.0 weight percent, the hydrogen peroxide being present in the bath at from 1.0 weight percent to 15.0 weight percent, the bath having a pH from 3.0 to 7.0; and
   after etching the carbon-containing masking layer, immersing the substrate within the bath under conditions effective to etch at least some of the polymer residue from over the aluminum-comprising conductive metal line.

10. The method of claim 9 wherein the carbon-containing masking layer comprises photoresist.

11. The method of claim 9 wherein the carboxylic acid buffering agent comprises ammonium citrate.

12. The method of claim 9 wherein the ammonium citrate is derived at least in part from adding diammonium citrate salt to an aqueous solution.

13. The method of claim 9 wherein the carboxylic acid buffering agent comprises ammonium oxalate.

14. The method of claim 9 wherein the carbon-containing masking layer etching leaves a polymer residue over at least some of the aluminum-comprising conductive metal line.

15. The method of claim 9 wherein the aluminum-comprising layer etching leaves a polymer residue over at least some of the aluminum-comprising conductive metal line.

16. A method of fabricating integrated circuitry comprising:
   forming an aluminum-comprising conductive metal line over a semiconductor substrate; and
   exposing at least sidewalls of the aluminum-comprising conductive metal line to a solution comprising an inorganic acid, hydrogen peroxide and a carboxylic acid buffering agent comprising a mixture of ammonium citrate and ammonium oxalate.

17. The method of claim 16 wherein the ammonium citrate is derived at least in part from adding diammonium citrate salt to an aqueous solution.

18. The method of claim 16 wherein the inorganic acid comprises $H_3PO_4$.

19. The method of claim 16 wherein the inorganic acid comprises $H_2SO_4$.

20. A method of fabricating integrated circuitry comprising:
- forming a patterned carbon-containing masking layer over an aluminum-comprising layer;
- using the masking layer, etching the aluminum-comprising layer to form an aluminum-comprising conductive metal line;
- after forming the aluminum-comprising conductive metal line, etching the carbon-containing masking layer from the substrate, at least one of the carbon-containing masking layer etching and the aluminum-comprising layer etching leaving a polymer residue over at least some of the aluminum-comprising conductive metal line;
- providing an immersion bath containing a solution comprising sulfuric acid, hydrogen peroxide, and a carboxylic acid buffering agent selected from the group consisting of ammonium citrate, ammonium oxalate, and mixtures thereof; the sulfuric acid being present in the bath at from 1.0 weight percent to 15.0 weight percent, the hydrogen peroxide being present in the bath at from 1.0 weight percent to 15.0 weight percent, the bath having a pH from 3.8 to 4.8; and
- after etching the carbon-containing masking layer, immersing the substrate within the bath under conditions effective to etch at least some of the polymer residue from over the aluminum-comprising conductive metal line.

21. The method of claim 20 wherein the carboxylic acid buffering agent comprises ammonium oxalate.

22. The method of claim 20 wherein the carboxylic acid buffering agent comprises ammonium citrate.

23. A method of fabricating integrated circuitry comprising:
- forming a patterned carbon-containing masking layer over an aluminum-comprising layer;
- using the masking layer, etching the aluminum-comprising layer to form an aluminum-comprising conductive metal line;
- after forming the aluminum-comprising conductive metal line, etching the carbon-containing masking layer from the substrate, at least one of the carbon-containing masking layer etching and the aluminum-comprising layer etching leaving a polymer residue over at least some of the aluminum-comprising conductive metal line;
- providing an immersion bath containing a solution comprising sulfuric acid, hydrogen peroxide, and a carboxylic acid buffering agent comprising a mixture of ammonium citrate and ammonium oxalate; the sulfuric acid being present in the bath at from 1.0 weight percent to 15.0 weight percent, the hydrogen peroxide being present in the bath at from 1.0 weight percent to 15.0 weight percent, the bath having a pH from 3.0 to 7.0; and
- after etching the carbon-containing masking layer, immersing the substrate within the bath under conditions effective to etch at least some of the polymer residue from over the aluminum-comprising conductive metal line.

24. The method of claim 23 wherein the carbon-containing masking layer etching leaves a polymer residue over at least some of the aluminum-comprising conductive metal line.

25. The method of claim 23 wherein the aluminum-comprising layer etching leaves a polymer residue over at least some of the aluminum-comprising conductive metal line.

* * * * *